United States Patent
Satake

(10) Patent No.: US 11,905,611 B2
(45) Date of Patent: Feb. 20, 2024

(54) MAINTENANCE MEMBER, SUBSTRATE HOLDING MODULE, PLATING APPARATUS, AND MAINTENANCE METHOD

(71) Applicant: EBARA CORPORATION, Tokyo (JP)

(72) Inventor: Masayuki Satake, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 99 days.

(21) Appl. No.: 17/171,280

(22) Filed: Feb. 9, 2021

(65) Prior Publication Data
US 2021/0262108 A1     Aug. 26, 2021

(30) Foreign Application Priority Data

Feb. 20, 2020  (JP) .................................. 2020-027351

(51) Int. Cl.
| | | |
|---|---|---|
| C25D 17/00 | (2006.01) | |
| C25D 7/12 | (2006.01) | |
| C25D 17/06 | (2006.01) | |

(52) U.S. Cl.
CPC ............. *C25D 17/005* (2013.01); *C25D 7/12* (2013.01); *C25D 17/06* (2013.01)

(58) Field of Classification Search
None
See application file for complete search history.

(56) References Cited

U.S. PATENT DOCUMENTS

| | | | | |
|---|---|---|---|---|
| 4,755,271 A | * | 7/1988 | Hosten | H05K 3/241 204/198 |
| 2002/0014309 A1 | * | 2/2002 | Takatoh | B24D 7/02 156/345.12 |
| 2012/0043200 A1 | | 2/2012 | Fujikata et al. | |
| 2014/0020720 A1 | * | 1/2014 | Fujikata | C25D 21/08 134/34 |
| 2018/0209062 A1 | * | 7/2018 | Nagai | C25D 17/001 |

FOREIGN PATENT DOCUMENTS

| | | |
|---|---|---|
| JP | 2012-062570 A1 | 3/2012 |
| JP | 2018-119176 A | 8/2018 |

* cited by examiner

*Primary Examiner* — Louis J Rufo
(74) *Attorney, Agent, or Firm* — BakerHostetler

(57) ABSTRACT

Provided is a maintenance member or the like capable of easily maintaining an electric contact in a substrate holder. It relates to a maintenance member to maintain a substrate holder including an electric contact configured to supply power to a substrate. The maintenance member includes an abrasive body having a shape corresponding to the substrate that is a holding target of the substrate holder, and disposed to come in contact with the electric contact when held by the substrate holder.

5 Claims, 6 Drawing Sheets

MAINTENANCE MEMBER, SUBSTRATE HOLDING MODULE, PLATING APPARATUS, AND MAINTENANCE METHOD

TECHNICAL FIELD

The present invention relates to a maintenance member, a substrate holding module, a plating apparatus, and a maintenance method.

BACKGROUND ART

Heretofore, a wiring has been formed in a fine wiring groove, hole or resist opening provided in a surface of a semiconductor wafer or the like, and a bump (a protruding electrode) to be electrically connected to a package electrode or the like has been formed on the surface of the semiconductor wafer or the like. As a method of forming the wiring and bump, for example, an electroplating method, a vapor deposition method, a printing method, a ball bump method, or the like is known. As an I/O number of a semiconductor chip increases and a pitch becomes finer, the electroplating method is often used in which miniaturization is possible and performance is comparatively stable.

A plating apparatus for use in the electroplating method includes a substrate holder that holds a substrate with an surface thereof to be plated being exposed, and plating can be performed by immersing, into a plating solution, with the substrate holder holding the substrate. During the plating, the substrate is required to be electrically connected to a negative voltage side of a power source, to apply a negative voltage to the substrate surface. For this purpose, in the substrate holder, electric contacts are provided to electrically connect wirings extending from the power source, and the substrate. The electric contacts are configured to come in contact with a seed layer (a conductive layer) formed on the surface of the substrate, thereby applying the negative voltage to the substrate.

CITATION LIST

Patent Literature

PTL1: Japanese Patent Laid-Open No. 2012-62570

SUMMARY OF INVENTION

Technical Problem

To improve uniformity of a thickness of a plating film formed on a surface to be plated of a substrate, it is preferable that a plurality of electric contacts are brought into contact with a seed layer along a peripheral edge of the substrate, and that a voltage is uniformly applied to the surface to be plated of the substrate. However, even if the voltage is uniformly applied to the surface to be plated of the substrate, when variations are present in respective contact resistances between the plurality of electric contacts and the seed layer of the substrate, in-plane uniformity of the plating film thickness decreases. Specifically, if the variations in contact resistances between the plurality of electric contacts and the seed layer increase, a current does not easily flow to a portion having a high contact resistance, and a film thickness in the vicinity of the portion decreases. The current easily flows to a portion having a low contact resistance, and a film thickness in the vicinity of the portion increases.

The variations in contact resistances between the substrate and the electric contacts may be generated due to a foreign substance that adheres on a surface of each electric contact of a substrate holder, for example. The electric contacts come in contact directly with the seed layer of the substrate, and hence, a seed layer material of the substrate may adhere on the electric contacts of the substrate holder. The electric contacts of the substrate holder are often formed of a material having a small electrical resistance, such as gold, and the seed layer of the substrate is formed of, for example, copper. If copper adheres on the electric contacts of the substrate and furthermore, copper oxidizes with the elapse of time, a contact resistance between a portion on which copper adheres and the seed layer of the substrate increases. Here, it is suggested that copper or copper oxide adhering on the electric contacts is dissolved and removed with chemicals, but the chemicals are required to be at high temperatures, and a long time is required, for removing copper or copper oxide with the chemicals.

The present invention has been developed in view of the above described situations, and one of objects thereof is to provide a maintenance member capable of easily maintaining an electric contact in a substrate holder, a substrate holding module, a plating apparatus, or a maintenance method.

Solution to Problem

According to an embodiment of the present invention, provided is a maintenance member to maintain a substrate holder including an electric contact configured to supply power to a substrate, and the maintenance member includes an abrasive body having a shape corresponding to the substrate that is a holding target of the substrate holder, and disposed to come in contact with the electric contact when held by the substrate holder.

According to another embodiment of the present invention, a substrate holding module is provided, and the substrate holding module includes a first holding member including an electric contact configured to supply power to a substrate, and a second holding member configured to hold the substrate between the first holding member and the second holding member, the second holding member including an abrasive body disposed at a position corresponding to the electric contact in the first holding member.

DESCRIPTION OF EMBODIMENTS

Figure 1:
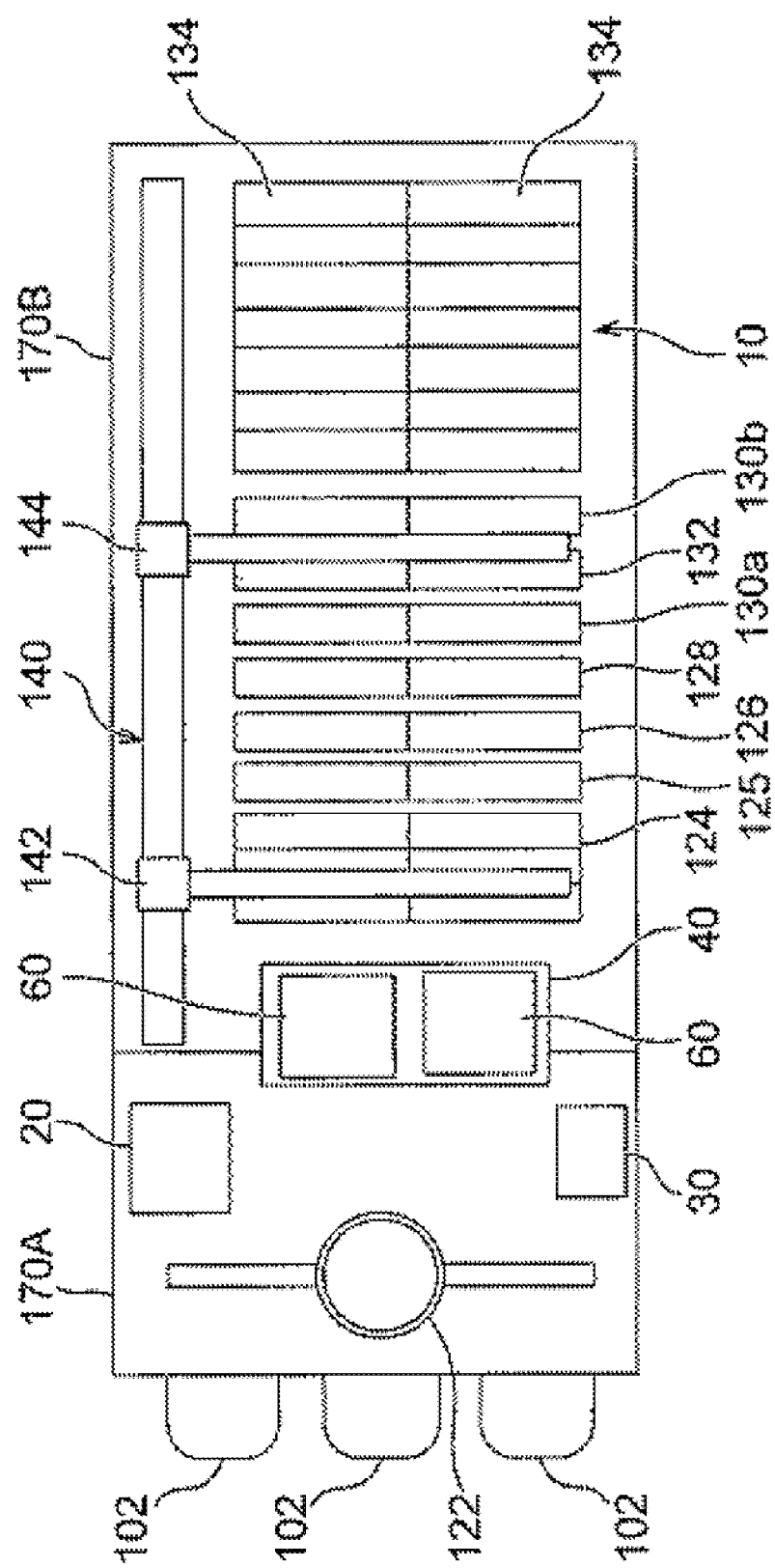
FIG. 1 is an entire arrangement view of a plating apparatus according to the present embodiment.

Hereinafter, embodiments of the present invention will be described with reference to drawings. In the drawings for use in the following description, the same or corresponding components are denoted with the same reference sign, and redundant description is omitted. FIG. 1 is an entire arrangement view of a plating apparatus according to the present embodiment. As shown in FIG. 1, this plating apparatus is roughly divided into a loader/unloader 170A that loads a substrate on a substrate holder 60, or unloads the substrate from the substrate holder 60, and a processor 170B that processes the substrate.

The loader/unloader 170A is provided with three front-opening unified pods (FOUPs) 102, an aligner 30, and a spin rinse dryer 20. In the FOUP 102, a plurality of substrates such as semiconductor wafers are stored in multiple stages. The aligner 30 aligns a position of an orientation flat, a notch, or the like of the substrate in a predetermined direction. The spin rinse dryer 20 spins at a high speed and dries the plated substrate. In the vicinity of the spin rinse dryer 20, a fixing unit 40 is provided on which the substrate holder 60 is mourned, to attach and detach the substrate. In a center of these units 102, 30, 20 and 40, disposed is a substrate transporter 122 comprising a transporting robot that transports the substrate among these units.

As an example, the fixing unit 40 is configured so that two substrate holders 60 can be mounted thereon. In the fixing unit 40, the substrate is transferred between one of the substrate holders 60 and the substrate transporter 122, and then, the substrate is transferred between the other substrate holder 60 and the substrate transporter 122.

The processor 170B of the plating apparatus includes a stocker 124, a substrate holder cleaner 125, a prewet tank 126, a presoak tank 128, a first cleaning tank 130a, a blow tank 132, a second cleaning tank 130b, and a plating tank 10. In the stocker 124, the substrate holder 60 is stored and temporarily placed. In the substrate holder cleaner 125, the substrate holder 60 is cleaned. In the prewet tank 126, the substrate is immersed into pure water. In the presoak tank 128, an oxide film that is present on a surface of a conductive layer such as a seed layer formed on a surface of the substrate is etched and removed. In the first cleaning tank 130a, the presoaked substrate is cleaned together with the substrate holder 60 in a cleaning solution (pure water or the like). In the blow tank 132, the cleaned substrate is drained. In the second cleaning tank 130b, the plated substrate is cleaned together with the substrate holder 60 in the cleaning solution. The stocker 124, the substrate holder cleaner 125, the prewet tank 126, the presoak tank 128, the first cleaning tank 130a, the blow tank 132, the second cleaning tank 130h and the plating tank 10 are arranged in this order as an example.

The plating tank 10 includes, for example, a plurality of plating cells 134 provided with an overflow tank. Each of the plating cells 134 accommodates the substrate holder 60 holding the substrate with a posture oriented in a vertical direction, and the substrate is immersed into a plating solution. In the plating cell 134, a voltage is applied across the substrate and an anode, to plate the substrate surface with, for example, copper.

The plating apparatus includes a substrate holder transporter 140 located on a side of each unit of equipment, to transport the substrate holder 60 together with the substrate between respective units of equipment, and in the transporter, for example, a linear motor system is adopted. The substrate holder transporter 140 includes a first transporter 142 and a second transporter 144. The first transporter 142 is configured to transport the substrate among the fixing unit 40, the stocker 124, the substrate holder cleaner 125, the prewet tank 126, the presoak tank 128, the first cleaning tank 130a and the blow tank 132. The second transporter 144 is configured to transport the substrate among the first cleaning tank 130a, the second cleaning tank 130b, the blow tank 132, and the plating tank 10. Specifically, the first transporter 142 and the second transporter 144 of the present embodiment transport the substrate holder 60 in a state where an in-plane direction of the held substrate is oriented in the vertical direction. In other words, the first transporter 142 and the second transporter 144 transport the substrate holder 60 that holds the substrate and is oriented in the vertical direction.

In another embodiment, the plating apparatus may include only one of the first transporter 142 and the second transporter 144, and the one transporter max transport the substrate among the fixing unit 40, the stocker 124, the substrate holder cleaner 125, the prewet tank 126, the presoak tank 128, the first cleaning tank 130a, the second cleaning tank 130b, the blow tank 132, and the plating tank 10.

First Embodiment

Figure 2:
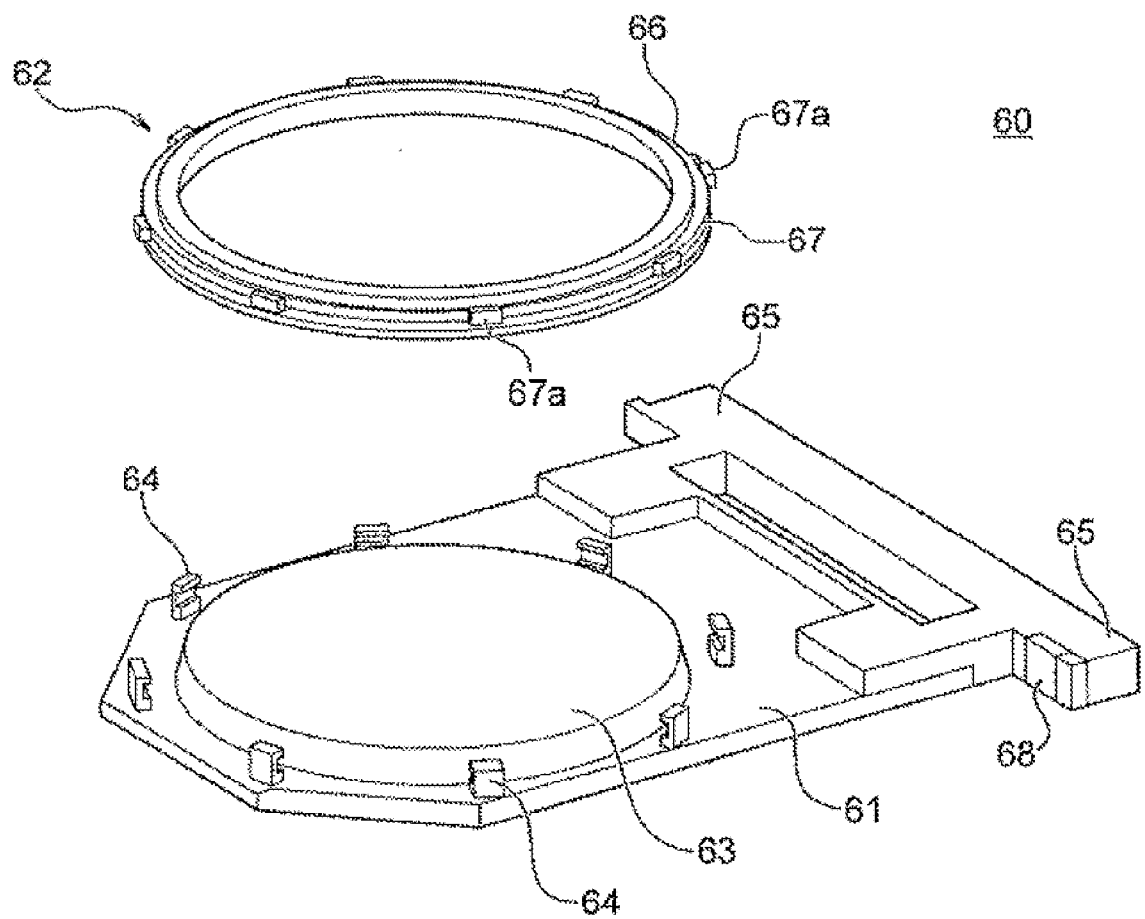
FIG. 2 is an exploded perspective view of a substrate holder according to a first embodiment.

Next, description will be made as to the substrate holder 60 of a first embodiment in detail. FIG. 2 is an exploded perspective view of the substrate holder 60 according to the first embodiment. As shown in FIG. 2, the substrate holder 60 includes, for example, a first holding member 61 made of vinyl chloride and having a rectangular flat plate shape, and a second holding member 62 configured to be attachable to and detachable from the first holding member 61. A mounting surface 63 on which a substrate Wf is mounted is provided in an almost central part of the first holding member 61 of the substrate holder 60. Furthermore, a plurality of dampers 64 having an inverted L-shape and each including an inwardly protruding protrusion are provided at an equal spacing along a circumference of the mounting surface 63, outside the mounting surface 63 of the first holding member 61.

A pair of hands 65 having an almost T-shape and serving as supports in transporting, suspending and supporting the substrate holder 60 are coupled to an end of the first holding member 61 of the substrate holder 60. In the stocker 124 shown in FIG. 1, the hands 65 are hooked on an upper surface of a peripheral wall of the stocker 124, and the substrate holder 60 is accordingly vertically suspended and supported. Also, the hands 65 of the suspended and supported substrate holder 60 are grasped with the substrate holder transporter 140 to transport the substrate holder 60.

Furthermore, at least one of the hands 65 is provided with external contacts 68 electrically connected to an external power source. The external contacts 68 are electrically connected to a plurality of relay contacts (see FIG. 3) provided on the circumference of the mounting surface 63 via a plurality of wirings.

The second holding member 62 includes a ring-shaped seal holder 66. A presser ring 67 to press and fix the seal holder 66 onto the first holding member 61 is rotatably mounted to the seal holder 66 of the second holding member 62. The second holding member 62 is attached to the first holding member 61, and the substrate Wf is thereby interposed and held between the first holding member 61 and the second holding member 62. The presser ring 67 includes a plurality of protruding parts 67a protruding outward from a circumference of the ring. An upper surface of each protruding part 67a and a lower surface of the inward protrusion of the damper 64 include tapered surfaces inclined in opposite directions along a rotation direction.

When holding the substrate, first, the substrate Wf is mounted on the mounting surface 63 of the first holding member 61 in a state where the second holding member 62 is removed from the first holding member 61, and the second holding member 62 is attached, Subsequently, the presser ring 67 is rotated clockwise, and the protruding parts 67a of the presser ring 67 are slid into interiors (lower sides) of the inward protrusions of the dampers 64. Consequently, the first holding member 61 and the second holding member 62 are fastened and locked to each other via the tapered surfaces that are provided on the presser ring 67 and the damper 64, respectively, to hold the substrate Wf. To release the held substrate Wf, in a state where the first holding member 61 and the second holding member 62 are locked, the presser ring 67 is rotated counterclockwise. Consequently, the protruding parts 67a of the presser ring 67 are removed from the inverted L-shaped dampers 64, and the held substrate Wf is released.

Note that in the example shown in FIG. 2, the first holding member 61 and the second holding member 62 are separated and shown. However, such an example is not restrictive, and the first holding member 61 and the second holding member 62 may be connected via a hinge, or coupled to each other otherwise.

Figure 3:
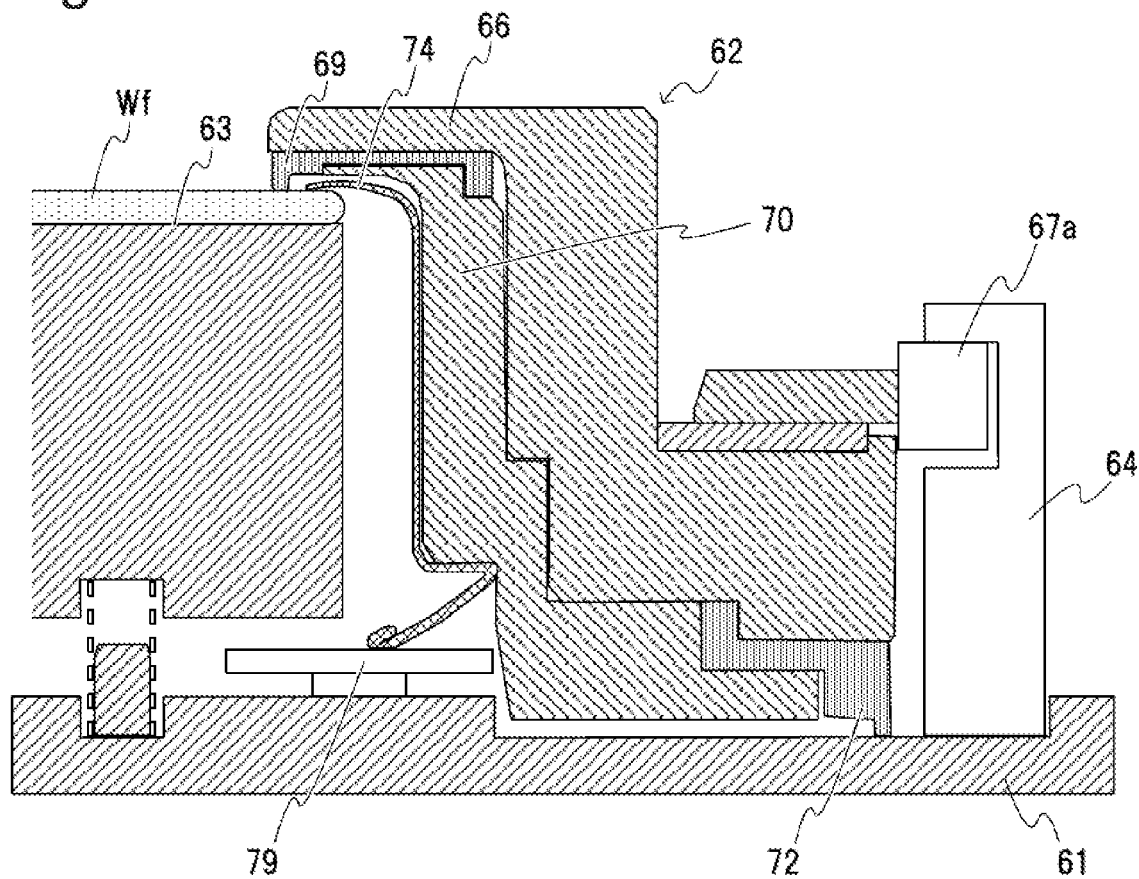
FIG. 3 is an enlarged partially cross-sectional view of the substrate holder shown in FIG. 2.

FIG. 3 is an enlarged partially cross-sectional view of the substrate holder 60 shown in FIG. 1. As shown in FIG. 3, the second holding member 62 includes a substrate side seal member 69 (corresponding to an example of a seal member) and a holder side seal member 72. The substrate side seal member 69 and the holder side seal member 72 are interposed between the seal holder 66 and a fixing ring 70. The seal holder 66 and the fixing ring 70 are fastened by an unshown fastener such as a screw.

As shown in FIG. 3, the second holding member 62 includes an electric contact 74 that comes in contact with a peripheral edge of a surface to be processed of the substrate Wf, to supply a current to the substrate Wf. A plurality of electric contacts 74 are provided along an inner circumference of the seal holder 66. Furthermore, the first holding member 61 includes a relay contact 79 that comes in contact with the electric contact 74 in a state where the second holding member 62 is attached to the first holding member 61, to supply a current from the external power source to the electric contact 74. A plurality of relay contacts 79 are provided along the circumference of the mounting surface 63. The relay contacts 79 conduct to the external contacts 68 (see FIG. 2), and consequently, power supplied from the external power source is supplied to the surface of the substrate Wf via the external contacts 68, the relay contacts 79, and the electric contacts 74.

Figure 4:
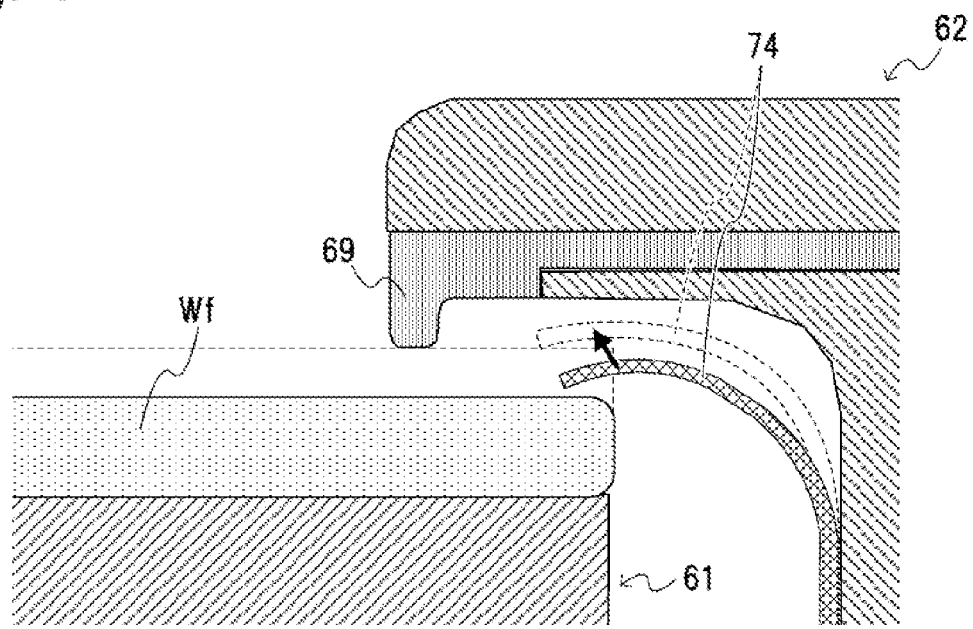
FIG. 4 is an enlarged view around an electric contact in the substrate holder shown in FIG. 2.

FIG. 4 is an enlarged view around the electric contact 74 in the substrate holder 60 shown in FIG. 2 and FIG. 3. Note that FIG. 4 shows, with a solid line, a state where the first holding member 61 is away from the second holding member 62, and shows, with a broken line, a state where the first holding member 61 and the second holding member 62 are locked. Note that FIG. 4 shows that the second holding member 62 moves toward the first holding member 61, to lock the first holding member 61 and the second holding member 62, but this example is not restrictive, and the first holding member 61 may move toward the second holding member 62. In the substrate holder 60 of the present embodiment, the electric contact 74 is curved toward the second holding member 62 (a substrate). Then, when the first holding member 61 comes close to the second holding member 62, the electric contact 74 comes in contact with the surface (a seed layer) of the substrate Wf before the first holding member 61 and the second holding member 62 are locked. In this state, when the first holding member 61 is further brought close to the second holding member 62, the electric contact 74 is pushed by the surface of the substrate Wf to bend, and slides on the surface of the substrate Wf toward a center of the substrate Wf (see the broken line in FIG. 4). When this configuration of the electric contact 74 locks the first holding member 61 and the second holding member 62, a tip of the electric contact 74 is pressed onto the surface (the seed layer) of the substrate Wf, so that the surface of the substrate Wf can suitably come in contact with the electric contact 74.

Upon locking the second holding member 62 to the first holding member 61, the electric contact 74 is brought into contact under pressure with the surface of the substrate Wf, and the substrate side seal member 69 is brought into contact under pressure with an outer peripheral portion of the surface of the substrate Wf. The substrate side seal member 69 is uniformly pressed onto the substrate Wf, thereby sealing a space between the outer peripheral portion of the surface of the substrate Wf and the second holding member 62. This prevents the plating solution or the cleaning solution from being brought into contact with the electric contact 74. Similarly, upon locking the second holding member 62 to the first holding member 61, as shown in FIG. 3, the holder side seal member 72 is brought into contact under pressure with a surface of the first holding member 61. The holder side seal member 72 is uniformly pressed onto the first holding member 61, thereby sealing a space between the first holding member 61 and the second holding member 62. This prevents the plating solution or the cleaning solution from being brought into contact with the electric contact 74.

Next, description will be made as to maintenance of the substrate holder 60 of the first embodiment. As described above, the electric contact 74 of the substrate holder 60 slides on the seed layer of the substrate Wf to directly come in contact. Consequently, a foreign substance that adheres on a seed layer material of the substrate Wf or the surface of the substrate Wf may adhere on the electric contact 74. Furthermore, the plating solution may come in contact with the electric contact 74 regardless of the sealing by the seal members 69, 72. If the seed layer material, the plating solution, or the like adheres on a surface of the electric contact 74, an electrical resistance of the electric contact 74 at a location where the material, the solution, or the like adheres may vary. Therefore, in the plating apparatus of the present embodiment, the substrate holder 60, particularly the electric contact 74 is maintained.

Figure 5:
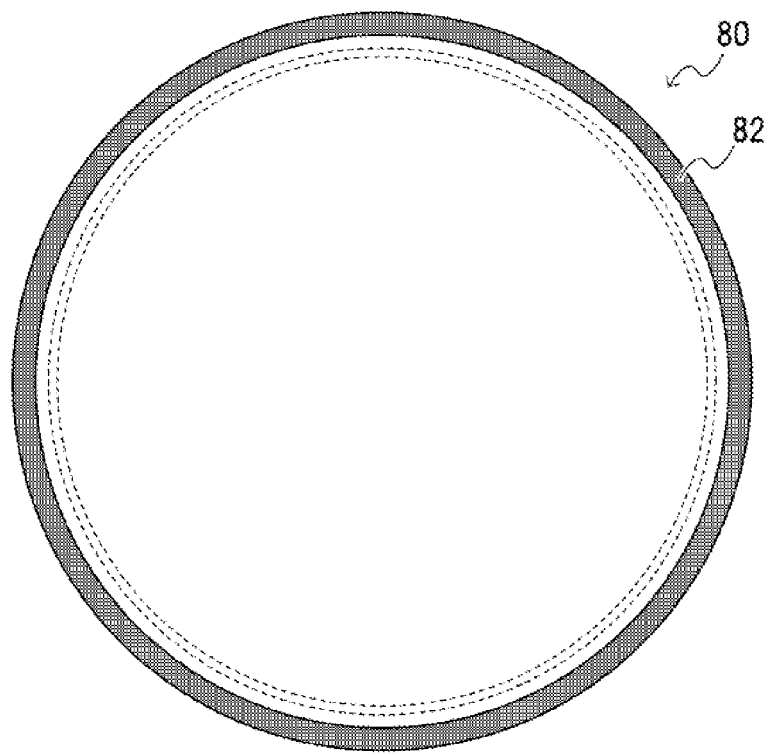
FIG. 5 is a view showing an example of a maintenance member according to the present embodiment.

FIG. 5 is a view showing an example of a maintenance member of the present embodiment. As shown in FIG. 5, a maintenance member 80 has a dimension corresponding to the substrate Wf that is a holding target of the substrate holder 60. Here, it can be considered that the dimension corresponding to the substrate Wf is about the same dimension as in the substrate Wf. It is preferable that the maintenance member 80 has about the same dimension as the substrate Wf particularly in the vicinity of an outer edge, but this is not limited to a configuration where the maintenance member entirely has exactly the same dimension as the substrate Wf. As an example, the maintenance member 80 may have an uneven part corresponding to, for example, an area exposed to the plating solution in the substrate Wf (hereinafter, also referred to as the "area to be plated"), or may have a thickness different from that of the substrate Wf. Thus, the maintenance member 80 has the dimension corresponding to the substrate Wf, so that the substrate holder 60 can hold the maintenance member 80 in the same manner as in the substrate NW. In the present embodiment, the substrate holder 60 and the maintenance member 80 correspond to an example of a "substrate holding module."

The maintenance member 80 includes an abrasive body 82 disposed to come in contact with the electric contact 74 when held by the substrate holder 60. Specifically, the maintenance member 80 is provided at a position corresponding to an area to be grasped by the substrate holder 60 (hereinafter, also referred to as the "area to be grasped") outside the area to be plated in the substrate Wf. It is preferable that the maintenance member 80 is disposed outside an area that comes in contact with the substrate side seal member 69 (an annular area surrounded with a broken line in FIG. 5) when held by the substrate holder 60. This can prevent the substrate side seal member 69 from being damaged by the abrasive body 82. Furthermore, it is preferable that an abrasive surface of the abrasive body 82 is flush with the area that comes in contact with the substrate side seal member 69.

The abrasive body 82 can be formed, for example, by attaching an abrasive sheet to a plate surface of the maintenance member 80. As abrasive grains in the abrasive body 82, for example, diamond can be adopted, but any material may be used. It is preferable that the abrasive grains in the abrasive body 82 have an average particle median diameter of 3 µm or less, and it is especially preferable that the abrasive grains have an average particle median diameter of 2 µm or less, 1 µm or less, 0.5 µm or less, or 0.3 µm or less. Note that in the present embodiment, the average particle median diameter is defined as a D50 value obtained by measuring a particle size distribution on a volume basis by a laser diffraction method.

Figure 6:
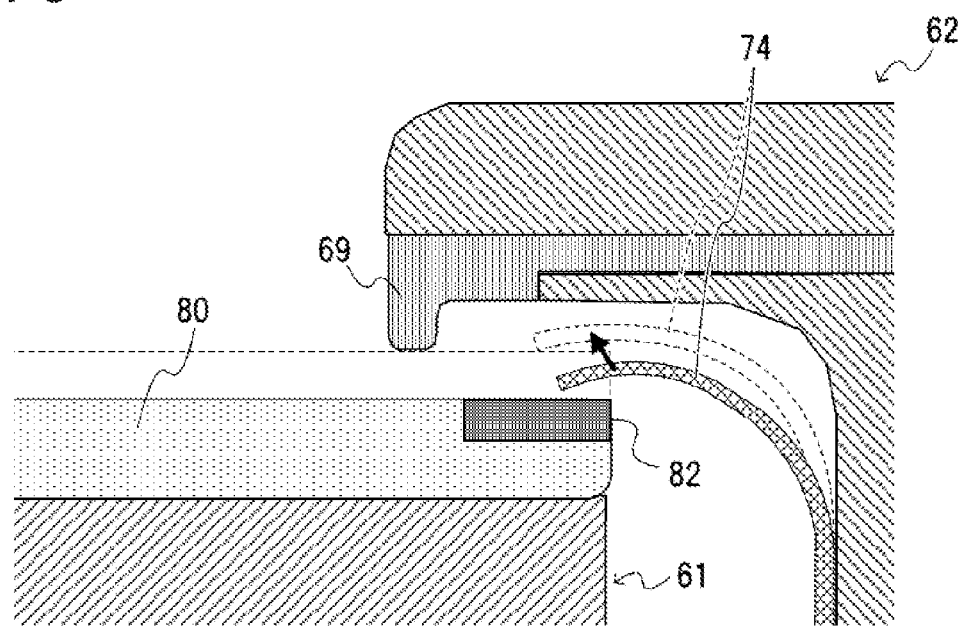
FIG. 6 is a view schematically showing maintenance of the electric contact by use of the maintenance member in the first embodiment.

The electric contact 74 of the substrate holder 60 can be easily maintained by using the maintenance member 80 described above. FIG. 6 is a view schematically showing the maintenance of the electric contact 74 by use of the maintenance member 80 in the present embodiment. The substrate holder 60 can hold the maintenance member 80 in the same manner as in holding the substrate Wf that is the holding target. As described above, in the present embodiment, the electric contact 74 of the substrate holder 60 is curved toward the second holding member 62. Consequently, when the first holding member 61 and the second holding member 62 are brought close to each other to hold the maintenance member 80, the electric contact 74 comes in contact with the abrasive body 82 of the maintenance member 80 before the first holding member 61 and the second holding member 62 are locked. In this state, when the first holding member 61 and the second holding member 62 are further brought close to each other, the electric contact 74 is pushed by the maintenance member 80 to bend, and slides on the abrasive body 82 toward a center of the maintenance member 80 (see a broken line in FIG. 6). Consequently, the electric contact 74 is abraded by the abrasive body 82, to remove the foreign substance that adheres on the surface of the electric contact 74, so that the electric contact 74 can be maintained. That is, according to the maintenance member 80 of the present embodiment, the maintenance member 80 is held by the substrate holder 60 in the same manner as in holding the substrate Wf that is the plating target, to remove the foreign substance that adheres on the electric contact 74, so that the maintenance can be performed.

As an example, the maintenance member 80 may be disposed at a predetermined position in the FOUP 102, and may be transported to the fixing unit 40 by the substrate transporter 122 in the same manner as in transporting the substrate Wf. However, the maintenance member 80 may be placed at a location separate from that of the FOUP 102. For example, the maintenance member 80 may be placed at a predetermined location that is accessible by the substrate transporter 122 in the plating apparatus. Note that when the substrate holder 60 is maintained by using the maintenance member 80, the fixing unit 40 may repeatedly lock the first holding member 61 and the second holding member 62, and release the locking a predetermined number of times (e.g., several times). Consequently, the electric contact 74 and the abrasive body 82 are slid a predetermined number of times, and the electric contact 74 can be sufficiently abraded.

Figure 7:
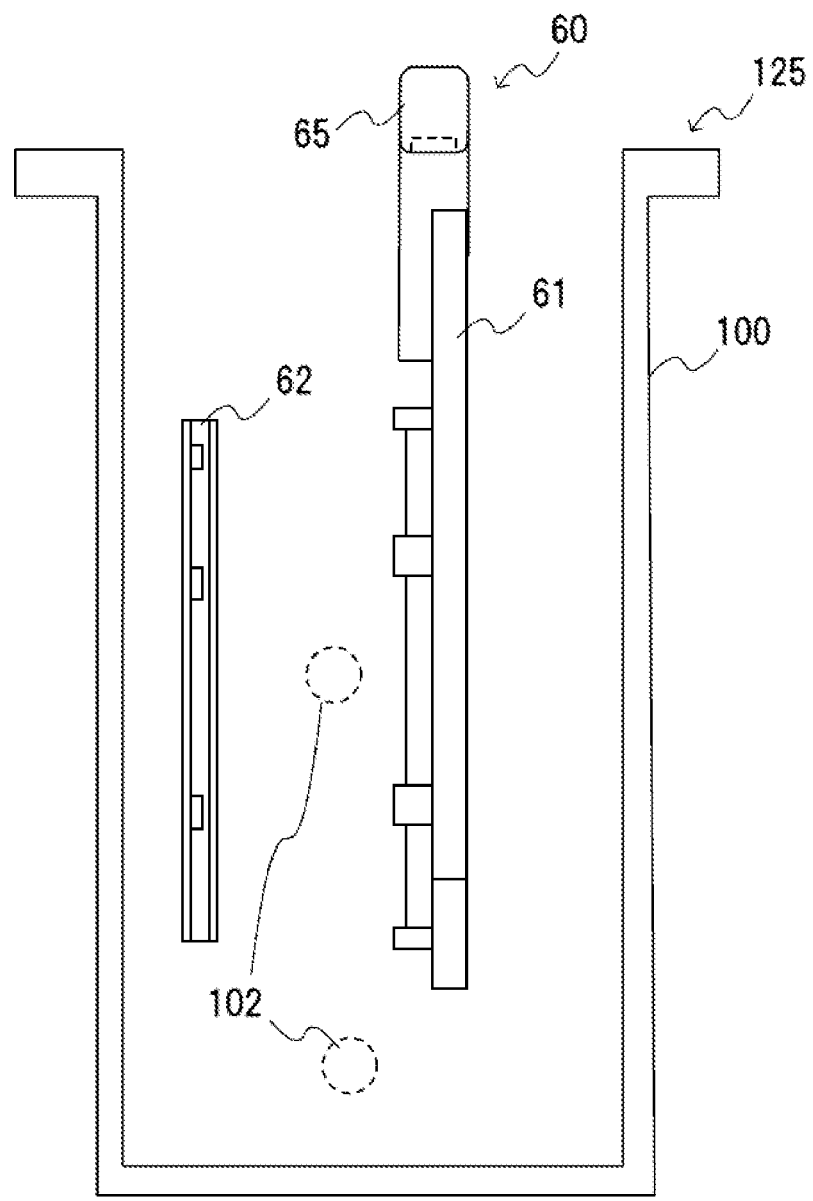
FIG. 7 is a view showing an example of a substrate holder cleaner.

After the substrate holder 60 is maintained by using the maintenance member 80, the substrate holder 60 may be cleaned in the substrate holder cleaner 125. FIG. 7 is a view showing an example of the substrate holder cleaner 125. The substrate holder cleaner 125 includes a rectangular processing tank 100 opened upward so that the hands 65 of the substrate holder 60 are hooked on an upper end surface to suspend and hold the substrate holder 60. In a side part and a bottom part of the processing tank 100, provided are cleaning solution suppliers 102 that spray and supply the cleaning solution, such as pure water, from the side and from below toward the substrate holder 60 that does not hold the substrate and is opened. Here, in the substrate holder cleaner 125, it is preferable that the substrate holder 60 is cleaned in a state where the first holding member 61 and the second holding member 62 are opened so that a seal area in the substrate holder 60 (an area to be sealed by the seal members 69, 72) can be cleaned. Note that in an example shown in FIG. 7, the first holding member 61 and the second holding member 62 are separately shown. However, the first transporter 142 may separately transport the first holding member 61 and the second holding member 62, and the first holding member 61 and the second holding member 62 may be opened in the processing tank 100 by an unshown mechanism of the substrate holder cleaner 125. Thus, after the maintenance of the substrate holder 60 by use of the maintenance member 80, the substrate holder 60 is cleaned in the substrate holder cleaner 125, so that abrasive waste or the like by the abrasive body 82 can be cleaned. Note that the substrate holder cleaner 125 may be further provided with an ultrasonic generation mechanism to generate ultrasonic waves and thereby clean the substrate holder 60, a blow mechanism to blow air to the substrate holder 60, or the like.

As an example, the plating apparatus may maintain the electric contact 74 by use of the maintenance member 80 when the number of times of the plating of the substrate Wf by use of the substrate holder 60 reaches a predetermined number of times (e.g., dozens of times, or hundreds of times), or every predetermined time (e.g., several hours, a day, or several days). Furthermore, the plating apparatus may determine whether or not to maintain the electric contact 74, based on electrical resistance value between a substrate that is a plating target or a dedicated inspecting substrate, and the electric contact 74 of the substrate holder 60.

Figure 8:
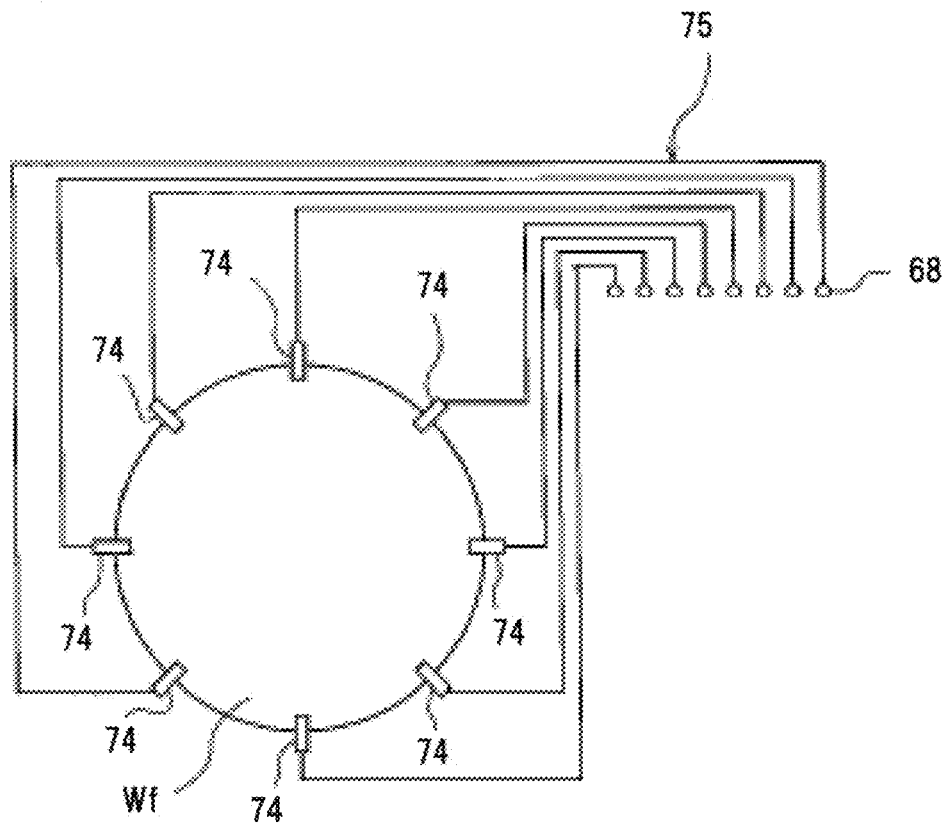
FIG. 8 is a view schematically showing an example of arrangement of electric contacts and wirings.

FIG. 8 is a view schematically showing an example of arrangement of the electric contacts 74 and wirings. If a resistance measuring instrument is connected to two (e.g., wirings connected to opposite electric contacts 74) of wirings 75 that are connected to a plurality of electric contacts 74, respectively, in a state where the substrate or the inspecting substrate is held by the substrate holder 60, then an electric circuit connecting two electric contacts 74 to the resistance measuring instrument is formed. Therefore, an electrical resistor can measure a combined resistance including electrical resistances of two electric contacts 74. Then, an unshown controller of the plating apparatus determines to maintain the electric contact 74, if the combined resistance is not within a predetermined allowable range (a first allowable range), as an example.

Furthermore, instead of or in addition to determining whether or not to maintain the electric contact 74, the unshown controller of the plating apparatus may determine whether or not the maintenance of the electric contact 74 by use of the maintenance member 80 is sufficiently performed, based on the measuring of the electrical resistance of the electric contact 74. That is, the plating apparatus may bring the abrasive body 82 and the electric contact 74 into contact with each other by use of the maintenance member 80, then measure the electrical resistance of the electric contact 74 while the substrate holder 60 holds the substrate or the inspecting substrate, and determine whether or not the maintenance of the electric contact 74 is completed. In this case, the unshown controller of the plating apparatus may determine that the maintenance of the electric contact 74 is completed, if the combined resistance including the electrical resistances of two electric contacts 74 is within the predetermined allowable range (a second allowable range). Furthermore, the controller may again execute the maintenance of the electric contact 74 by use of the maintenance member 80, if the combined resistance is not within the second allowable range. Here, it is preferable that the second allowable range to determine whether or not the maintenance is completed is a range that is narrower than the first allowable range to determine whether or not to perform the maintenance. Consequently, the maintenance of the electric contact 74 can be inhibited from being frequently performed.

Second Embodiment

Figure 9:
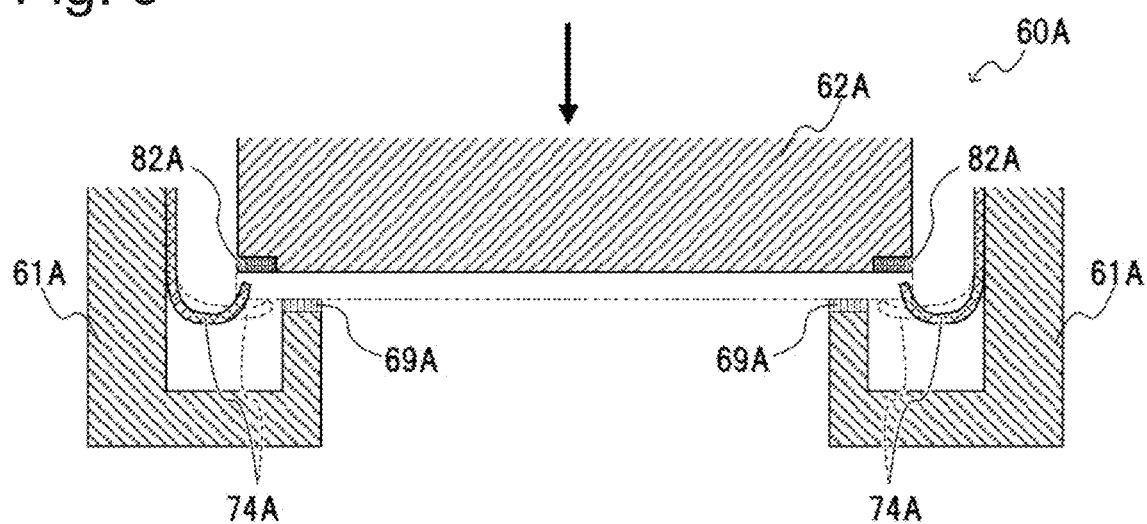
FIG. 9 is a view schematically showing a configuration of a substrate holding module of a second embodiment.

FIG. 9 is a view schematically showing a configuration of a substrate holding module of a second embodiment. In the first embodiment, the substrate holder 60 including the first holding member 61 and the second holding member 62 is maintained by using the maintenance member 80. On the other hand, in the substrate holding module of the second embodiment, a second holding member 62A of a substrate holder 60A is provided with an abrasive body 82A.

The substrate holder 60A of the second embodiment includes a first holding member 61A and the second holding member 62A. Note that the second holding member 62A may be a part of a fixing unit 40. The first holding member 61A includes an electric contact 74A that comes in contact with a seed layer of a substrate (not shown in FIG. 9), to supply power to the substrate. The electric contact 74A is curved toward the second holding member 62A (a substrate) in the same manner as the electric contact 74 of the first embodiment. Then, when the first holding member 61A and the second holding member 62A are brought close to each other, the electric contact 74A comes in contact with a surface (the seed layer) of the substrate before the first holding member 61A and the second holding member 62A are locked. In this state, when the first holding member 61A and the second holding member 62A are further brought close to each other, the electric contact 74A is pushed by the surface of the substrate to bend and slides on the surface of the substrate toward a center of the substrate.

The second holding member 62A includes the abrasive body 82A at a position corresponding to the electric contact 74A in the first holding member 61A. Note that in the same manner as in the first embodiment, if the first holding member 61A includes a substrate side seal member 69A that comes in contact with a plate surface of a substrate Wf, the abrasive body 82A may be disposed outside an area corresponding to the substrate side seal member 69A. The abrasive body 82A that is similar to the abrasive body 82 of the first embodiment may be adopted. As an example, an abrasive surface of the abrasive body 82A is flush with an area that comes in contact with the substrate in the second holding member 62A. However, the abrasive body 82A may be provided at a position farther away from the first holding member 61A than the area that comes in contact with the substrate in the second holding member 62A so that the abrasive body does not come in contact with the substrate that is a holding target.

According to the substrate holding module of the second embodiment, the first holding member 61A and the second holding member 62A are brought close to each other via no substrate, so that the abrasive body 82A provided in the second holding member 62A can come in contact with the electric contact 74A. At this time, in the substrate holding module, it is preferable that the second holding member 62A is close to the first holding member 61A by a thickness of the substrate as compared with a case where the substrate is held. Consequently, the electric contact 74. A can come in contact with the abrasive body 82A in the same manner as in a case where the electric contact 74A comes in contact with the seed layer of the substrate. Note that at this time, in the substrate holding module, the first holding member 61A and the second holding member 62A may be repeatedly brought close to and away from each other a predetermined number of times (e.g., several times) in the same manner as in a case where the electric contact 74A and the abrasive body 82A are slid a plurality of times. Also, in this substrate holding module of the second embodiment, the electric contact 74A is abraded with the abrasive body 82A, so that the foreign substance that adheres on the surface of the electric contact 74A can be removed.

(Modification)

Note that in the above embodiments, the substrate holder 60 includes the substrate side seal member 69 that comes in contact with the surface of the substrate Wf so that the plating solution does not come in contact with the electric contact 74. However, the substrate holder 60 may be configured so that during the plating, the plating solution comes in contact with the electric contact 74. Also, in this case, as described above, a contact part of the electric contact 74 is abraded by using the maintenance member 80, so that a foreign substance that adheres on the contact part can be removed.

Furthermore, in the above embodiments, the substrate holder 60 is inserted into the plating tank 10 in the state where the substrate is orientated in the vertical direction (the plate surface is oriented in a horizontal direction). However, such an example is not restrictive, and as an example, the substrate holder 60 may be configured to hold the substrate in a state where the substrate is oriented in the horizontal direction (the plate surface is oriented in the vertical direction) during the plating.

The present embodiments described above can be described also in the following aspects.

[Aspect 1]

According to aspect 1, provided is a maintenance member to maintain a substrate holder including an electric contact configured to supply power to a substrate, and the maintenance member includes an abrasive body having a shape corresponding to the substrate that is a holding target of the substrate holder, and disposed to come in contact with the electric contact when held by the substrate holder. According to aspect 1, the electric contact in the substrate holder can be easily maintained.

[Aspect 2]

According to aspect 2, in aspect 1, the abrasive body is formed of an abrasive sheet coated with abrasive grains, and the abrasive grains have an average particle median diameter of 3 μm or less. According to aspect 2, the electric contact can be inhibited from being damaged.

[Aspect 3]

According to aspect 3, in aspect 1 or 2, the substrate holder includes a seal member that comes in contact with the substrate when holding the substrate, and the abrasive body is disposed outside a position that comes in contact with the seal member when held by the substrate holder. According to aspect 3, the seal member can be inhibited from being damaged by the abrasive body.

[Aspect 4]

According to aspect 4, a substrate holding module is provided, and the substrate holding module includes a substrate holder including an electric contact configured to supply power to a substrate, and the maintenance member according to aspects 1 to 3. According to aspect 4, the electric contact of the substrate holder in the substrate holding module can be easily maintained.

[Aspect 5]

According to aspect 5, in aspect 4, the substrate holder includes a first holding member, and a second holding member configured to hold the substrate between the first holding member and the second holding member, and the electric contact is provided in at least one of the first holding member and the second holding member.

[Aspect 6]

According to aspect 6, a substrate holding module is provided, and the substrate holding module includes a first holding member including an electric contact configured to supply power to a substrate, and a second holding member configured to hold the substrate between the first holding member and the second holding member, the second holding member including an abrasive body disposed at a position corresponding to the electric contact in the first holding member. According to aspect 6, the electric contact provided in the first holding member can be easily maintained by the abrasive body provided in the second holding member,

[Aspect 7]

According to aspect 7, in aspects 4 to 6, the electric contact is configured to slide on the substrate, when the substrate holder holds the substrate.

[Aspect 8]

According to aspect 8, a plating apparatus is provided, and the plating apparatus includes the substrate holding module of aspects 4 to 7, and a plating module that plates a substrate held by the substrate holder in the substrate holding module.

[Aspect 9]

According to aspect 9, provided is a maintenance method of maintaining a substrate holder including an electric contact configured to supply power to a substrate, and the maintenance method includes a maintenance step of holding, by the substrate holder, the maintenance member of aspects 1 to 3.

[Aspect 10]

According to aspect 10, in aspect 9, the method further includes a step of holding, by the substrate holder, a substrate or an inspecting substrate, a step of measuring electrical resistance between the substrate or the inspecting substrate and the electric contact, and a step of determining to perform the maintenance step, based on the measured electrical resistances. According to aspect 10, the maintenance of the electric contact can be executed based on the electrical resistance between the substrate or the inspecting substrate and the electric contact.

This application is based upon and claiming the benefit of priority from Japanese Patent Application No. 2020-27351, filed on Feb. 20, 2020. All disclosed contents including the description, claims, drawings and abstract of Japanese Patent Application No. 2020-27351 are incorporated as a whole herein by reference. All disclosure of Japanese Patent Laid-Open No. 2012-62570 (PTL 1) is incorporated as a whole herein by reference.

Several embodiments of the present invention have been described above, but the above embodiments of the invention make it easy to understand the present invention, and do not restrict the present invention. Needless to say, the present invention may be changed or modified within the gist of the present invention, and the present invention includes equivalents. Furthermore, in a range in which at least a part of the above described problem can be solved or in a range in which at least a part of an effect is produced, any components described in claims and description can be combined or omitted.

REFERENCE SIGNS LIST

Wf substrate
10 plating tank
40 fixing unit
60, 60A substrate holder
61, 61A first holding member
62, 62A second holding member
69, 69A substrate side seal member
72 holder side seal member
74, 74A electric contact
80 maintenance member
82, 82A abrasive body
122 substrate transporter
125 substrate holder cleaner
140 substrate holder transporter
142 first transporter
144 second transporter
170A loader/unloader
170B processor

What is claimed is:

1. A substrate holding module comprising:
a first holding member including an electric contact configured to supply power to a substrate to be plated and a seal member configured to come in contact with the substrate to be plated, and
a second holding member configured to hold the substrate between the first holding member and the second holding member, the second holding member including an abrasive body that is not disposed at a position corresponding to the seal member in the first holding member and is disposed at a position corresponding to the electric contact in the first holding member, wherein the substrate to be plated is held between the first holding member and the second holding member while the substrate to be plated is positioned between the abrasive body and the electric contact.

2. The substrate holding module according to claim 1, wherein the electric contact is configured to slide on the substrate to be plated, when the substrate holder holds the substrate to be plated.

3. The substrate holding module according to claim 1, wherein the abrasive body is provided at a position farther away from the first holding member than an area that comes in contact with the substrate to be plated in the second holding member when the substrate to be plated is held between the first holding member and the second holding member.

4. The substrate holding module according to claim 1, wherein the abrasive body is formed of an abrasive sheet coated with abrasive grains, and the abrasive grains have an average particle median diameter of 3 µm or less.

5. A plating apparatus comprising:
  the substrate holding module according to claim 1, and
  a plating module that plates a substrate held by the substrate holder in the substrate holding module.

* * * * *